United States Patent
Afghahi

[19]

[11] Patent Number: 6,046,444
[45] Date of Patent: Apr. 4, 2000

[54] HIGH SENSITIVITY ACTIVE PIXEL WITH ELECTRONIC SHUTTER

[75] Inventor: Morteza Afghahi, Tempe, Ariz.

[73] Assignee: Intel Corporation, Santa Clara, Calif.

[21] Appl. No.: 08/987,176

[22] Filed: Dec. 8, 1997

[51] Int. Cl.[7] .......................... G11C 19/30; H01L 27/02; H01L 27/146
[52] U.S. Cl. .................................. 250/208.1; 250/214 A; 348/308
[58] Field of Search ........................... 250/208.1, 214 LS, 250/214 LA, 214 A, 214 C, 214.1, 214 R; 348/294, 297, 248, 300, 301, 302, 303, 308, 311, 312; 257/225, 231, 236, 239, 290, 291, 292, 294, 443, 444; 327/94; 377/60, 61, 62, 63

[56] References Cited

U.S. PATENT DOCUMENTS

| | | | |
|---|---|---|---|
| 5,471,515 | 11/1995 | Fossum et al. . | |
| 5,541,402 | 7/1996 | Ackland et al. . | |
| 5,614,744 | 3/1997 | Merrill | 257/291 |
| 5,835,141 | 11/1998 | Ackland et al. | 348/308 |
| 5,841,126 | 11/1998 | Fossum et al. . | |
| 5,841,176 | 11/1998 | Merrill | 257/446 |
| 5,844,598 | 12/1998 | Janesick | 348/79 |
| 5,847,422 | 12/1998 | Chi et al. | 257/291 |
| 5,854,100 | 12/1998 | Chi | 438/202 |

Primary Examiner—John R Lee
Attorney, Agent, or Firm—Blakely, Sokoloff, Taylor & Zafman LLP

[57] ABSTRACT

A high sensitivity active pixel for use in MOS image sensor circuits. The pixel circuit design allows the use of digital MOS fabrication processes to be used in implementing a pixel circuit having greater sensitivity (allowing increased frame rate) and greater noise immunity than certain prior art pixels. The novel pixel features a source follower configured amplifier, such as a single MOS FET, coupled between a photodetector and a storage capacitor. A light-generated signal from the photodetector is used to control the charge placed in the storage capacitor in order to develop a capture voltage. In a particular embodiment, an n-channel source follower and a p-channel output stage are combined in the pixel to make the overall transfer function of the pixel more linear and distortion-free. In particular, the pixel transfer function becomes more linear for weak light-generated signals, whereas with conventional pixels, the pixel output signals are often distorted and even suppressed when the light-generated signal is weak. The novel pixel circuit may find particular use in a portable digital image capture system such as a digital camera.

22 Claims, 4 Drawing Sheets

HIGH SENSITIVITY ACTIVE PIXEL WITH ELECTRONIC SHUTTER

BACKGROUND

This invention is related to electronic image sensor circuits built using metal oxide semiconductor (MOS) fabrication processes.

Image sensor circuits are used in a variety of different types of digital image capture systems, including products such as scanners, copiers, and digital cameras. The image sensor is typically composed of an array of light-sensitive pixels that are electrically responsive to incident light reflected from an object or scene whose image is to be captured.

FIG. 1 illustrates a prior art pixel 100 with electronic shutter that may be built using MOS fabrication processes. The pixel 100 includes a photodiode $PD_{10}$ coupled to a RESET field effect transistor (FET) $M_{10}$ with an electronic shutter mechanism provided by a SAMPLE transistor $M_{11}$ and a storage capacitor $C_1$. In operation, the pixel 100 is reset by applying a RESET signal which causes the RESET transistor to provide a low impedance path and thus reverse bias $PD_{10}$. Next, a SAMPLE signal is applied to create a low impedance path between nodes A and B, thereby charging $C_1$ to a reset level that is typically close to the rail or supply voltage $V_{DD}$.

When the object or scene comes into view of the sensor circuit and the incident light is allowed to shine on $PD_{10}$, node A is isolated from $V_{DD}$ by deasserting the RESET signal, and the voltage at nodes A and B begins to decay. The rate of decay is determined by the photocurrent $I_{PHOTO}$ in $PD_{10}$ (caused by light-generated electron-hole pairs), by any leakage current through $PD_{10}$, by the capacitance of $C_1$, by the parasitic capacitance of $C_{D1}$, and by any parasitic leakage paths to the nodes A and B (not shown).

After a predetermined interval, known as the exposure or integration time, has elapsed from the moment node A was isolated, node B is also isolated by deasserting SAMPLE, thereby capturing a light-generated "exposed" value at node B. The capacitance of $C_1$ is selected so that the exposed value may be held at node B until a related signal is read at the OUTPUT node.

To read the OUTPUT node, an ADDRESS signal is applied to the transistor $M_{13}$ which acts as a switch to cause a signal related to the exposed value to appear at the OUTPUT node. The difference between the exposed value and a "reset" value (representing the reset voltage at node B) gives a measure of the amount of light intensity that was incident on the pixel 100 during the exposure time. A similar but more complex read-out circuit having intra-pixel charge transfer is discussed in U.S. Pat. No. 5,471,515 to Fossum et al.

The performance of an image capture system depends in large part on the sensitivity of each individual pixel in the sensor array and its immunity from noise. Noise here is defined as small fluctuations in a signal that can be caused by a variety of known sources. Such sources include, for instance, undesirable leakage currents and manufacturing variations between pixels. An image sensor with increased noise immunity yields sharper, more accurate images in the presence of noise.

Improving the sensitivity of each pixel permits a reduction in exposure time which in turn allows the capture of images at a greater rate. This allows the image capture system to capture motion in the scene. In addition to allowing greater frame rate, higher pixel sensitivity also helps detect weaker incident light to capture acceptable quality images under low light conditions.

Pixel sensitivity is defined here as being related to the ratio of a change in the pixel output voltage (e.g., at the OUTPUT node of pixel 100) to the photogenerated charge in the pixel. For the prior art pixel 100 in FIG. 1, the sensitivity also depends in large part on the total capacitance of node B. The capacitance at node B includes the sum capacitance of $C_{D1}$ and $C_1$ where $C_{D1}$ is the photodiode diffusion parasitic capacitance. Reducing the sum capacitance increases sensitivity, because the change in the voltage at node B is increased when the capacitance is smaller for the same photogenerated charge. Reducing the capacitance, however, lowers noise immunity in that the voltage at node B is more susceptible to leakage currents.

Another way to increase pixel sensitivity is to increase the efficiency of the photodiode by changing the photodiode responsivity characteristics. Doing so, however, can require deviating from a standard MOS integrated circuit fabrication process, thereby further increasing the cost of manufacturing the image sensor circuit.

It is therefore desirable to have a pixel design with improved sensitivity and noise performance using electrical circuitry available with standard MOS fabrication processes.

SUMMARY

This invention in one embodiment is directed at a pixel having photodetecting, amplifying, and storage circuitry. The photodetecting circuitry provides a first signal in response to incident light. The amplifying circuitry receives a control signal and provides an output current in response to the first signal and the control signal, the output current being received by the storage circuitry.

In another embodiment of the invention, the pixel is part of an image sensor of an imaging system. The system includes an optical system for being exposed to incident light, an image sensor coupled to the optical system to receive the incident light, where each pixel in the sensor has photodetecting circuitry providing an original signal representative of the incident light, amplifying circuitry having a signal input, a control input, and an output, the amplifying circuitry providing an output current in response to receiving the original signal at the signal input and a first control signal at the control input, and storage circuitry coupled to the output for receiving the output current and in response providing an exposed voltage representative of the incident light. The system also includes analog-to-digital conversion circuitry coupled to the sensor for converting analog signals related to the exposed voltage in each pixel into digital signals representing raw image data, digital signal and image processing generating captured image data in response to receiving the digital signals, and an output interface for transferring the captured image data to an image processing system separate from the imaging system.

BRIEF DESCRIPTION OF THE DRAWINGS

These and other features as well as advantages of the different embodiments of the invention will be apparent by referring to the drawings, detailed description and claims below, where:

DETAILED DESCRIPTION

As summarized briefly above, an embodiment of the invention is directed at a high sensitivity active pixel in which the storage capacitor is separated from the photodetecting circuitry by an isolation stage including an amplifying device. The amplifying device can be a MOS FET configured as a source follower. The pixel can also include a read-out stage that provides an output signal in response to a voltage across the capacitor. Rather than acting as a switch as in the prior art pixel 100, the isolation stage acts as a high input impedance amplifier that permits the storage capacitance to be increased independently of the photodiode. This permits more noise immunity from leakage currents, without the conventional drop in sensitivity encountered when increasing the capacitance of the prior art pixel. Moreover, the pixel embodiments of the invention exhibit an increase in sensitivity by a factor of two or greater over the prior art pixel 100, for the same photodetector and storage capacitance.

Operation of the various embodiments of the invention will be explained using a MOS implementation of the circuits. The following short cuts are used in this disclosure to describe various operating regions of the FET. An FET is said to be "turned off" when $V_{GS}$ (gate-source voltage)$\leq V_T$ (threshold voltage) for the device and the device is operating in the cut-off region where its channel acts as an open circuit. When a FET is "turned on", $V_{GS} > V_T$, $V_{DS}$ (drain-source voltage) is normally small and the device is operating in the non-saturation region.

Figure 1:
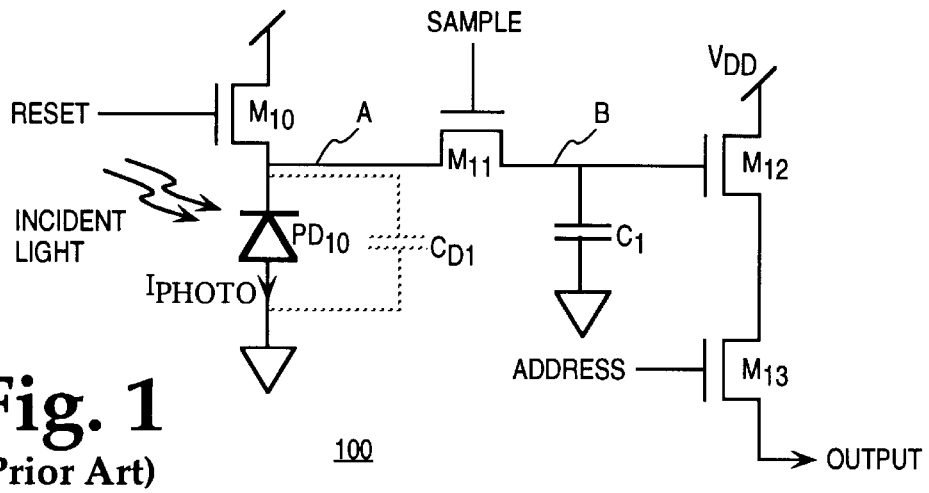
FIG. 1 illustrates a prior art pixel.
Figure 2:
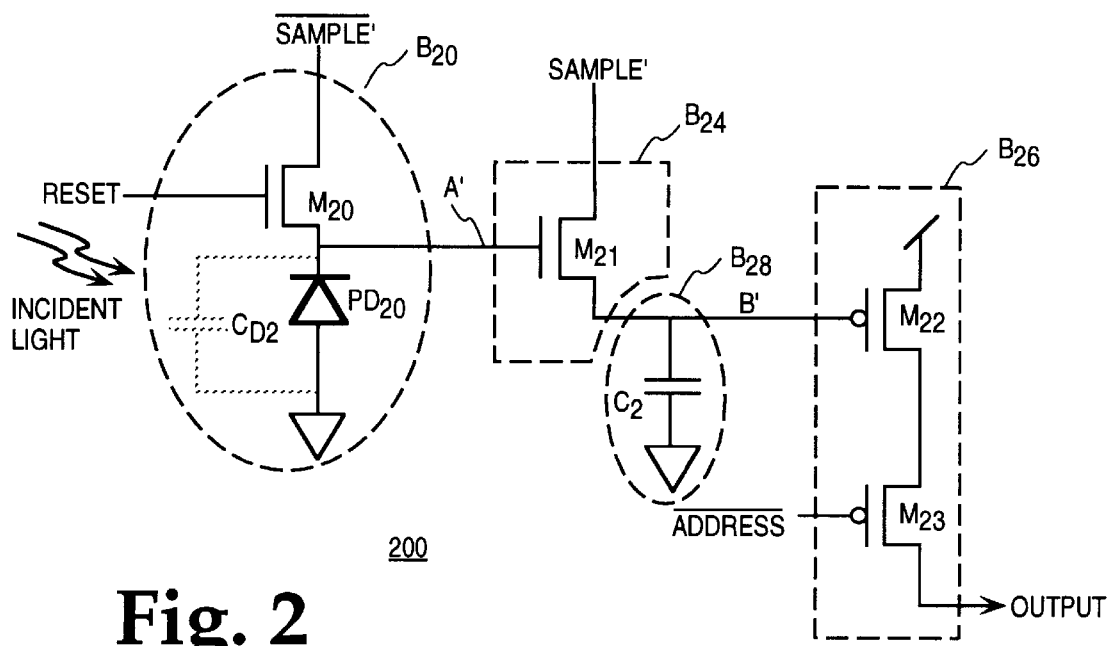
FIG. 2 is a schematic of pixel according to a first embodiment of the invention.

FIG. 2 illustrates a first embodiment of the invention as a pixel 200. The pixel 200 includes conventional photodetecting circuitry 204, including for this embodiment a photodiode $PD_{20}$ and RESET transistor $M_{20}$, which are also coupled to node A' and amplifier $B_{24}$. The photodiode $PD_{20}$ includes a parasitic capacitance, represented as $C_{D2}$. In this particular embodiment, the amplifier $B_{24}$ includes an n-channel FET $M_{21}$ which is configured as a source follower when SAMPLE is provided as a voltage supply at its drain (or control input). The FET $M_{21}$ receives a light-generated signal at its gate (or signal input) at node A', where the light-generated signal is the voltage across the photodiode $PD_{20}$ for this embodiment. The source (or output node) of $M_{21}$ is coupled to storage circuitry $B_{28}$ which in turn feeds an output stage $B_{26}$. The storage circuitry $B_{28}$ includes for this particular embodiment a single storage capacitor $C_2$ referenced to ground. The capacitance of $C_2$ can be comparable to $C_{D2}$ or even larger, depending on the desired sensitivity and noise immunity. The storage circuitry $B_{28}$ receives an output current from the amplifier $B_{24}$. The output current charges the storage capacitor $C_2$ to a voltage that is representative of the light-generated signal (voltage) at node A'.

Figure 3:
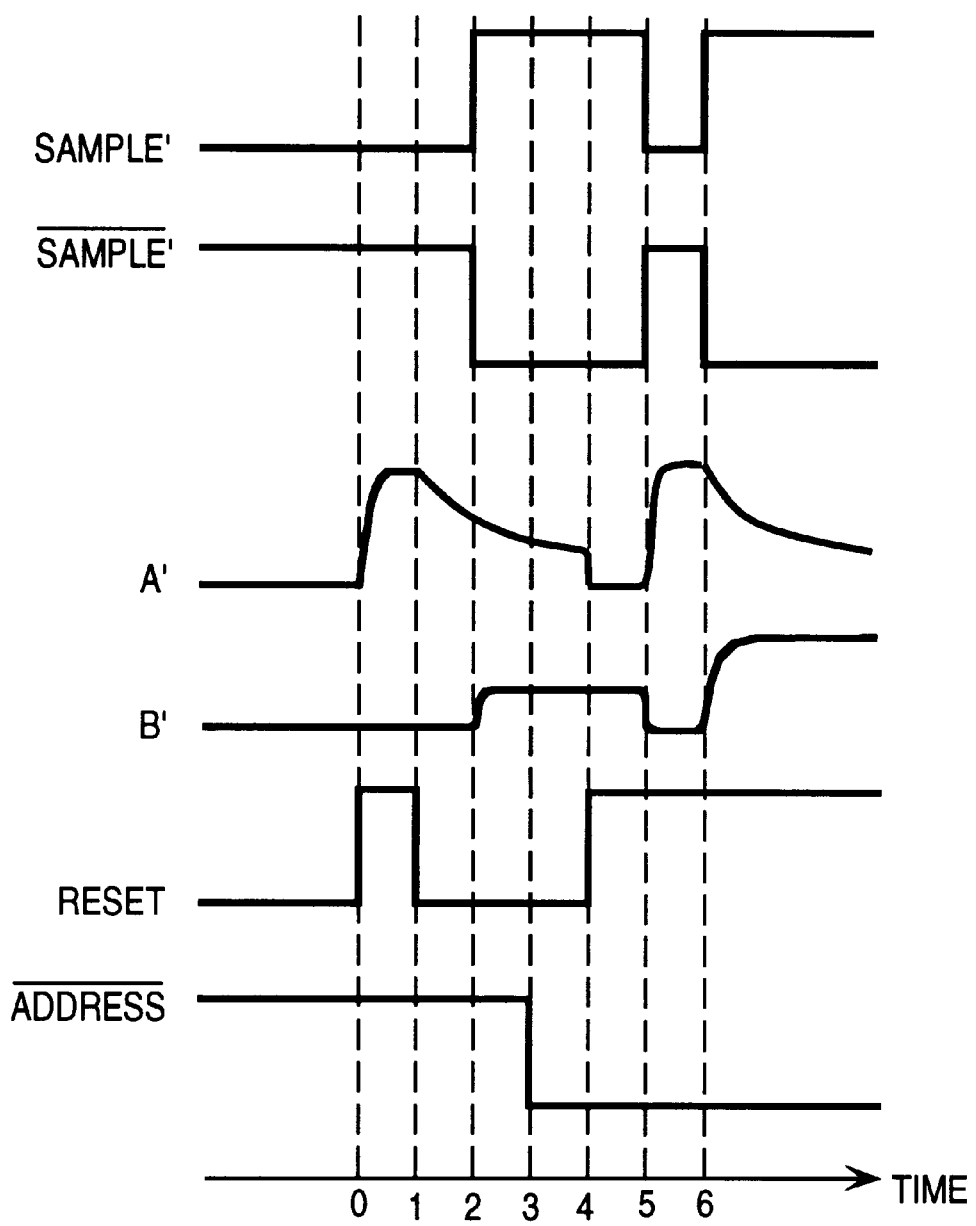
FIG. 3 is a timing diagram showing control signals used in various embodiments of the invention as well as intermediate signals within a pixel.

In operation, the pixel 200 of FIG. 2 operates according to the exemplary timing diagram in FIG. 3. The circuit operation will be described with reference to the time points in the time line of FIG. 3 and the control and test signals of the pixel 200.

At time 0, the RESET transistor is turned on thereby charging the capacitance $C_{D2}$ at node A' up to a voltage defined by $\overline{SAMPLE}$ (the inverse of SAMPLE). Although node A' will rise to a point that is sufficient to turn on $M_{21}$, as long as the SAMPLE voltage is kept close to ground the storage capacitor $C_2$ will remain discharged.

At time 1, the RESET signal is toggled thereby turning off the RESET transistor, starting what is conventionally known as the exposure or integration time. Beginning at time 1 and ending at time 4, the voltage at node A' decays as $C_{D2}$ is discharged in response to a photocurrent in the photodiode $PD_{20}$. The photocurrent (and hence the decay rate at node A') is related to the light intensity incident upon the pixel 200.

At time 2, SAMPLE (and $\overline{SAMPLE}$) are toggled such that $M_{21}$ is configured as a source follower thereby charging $C_2$ to a captured voltage $V_{A'}-V_T$ at node B', where $V_T$ is a threshold voltage of FET $M_{21}$. Thereafter, between time 2 and time 3, the voltage at A' continues to decay such that $V_{GS}<V_T$, thereby tending to turn off $M_{21}$. The source follower $M_{21}$ operated in this manner thus acts like a peak detector.

At time 3, the ADDRESS voltage is toggled thereby turning on $M_{23}$. A voltage or current at the OUTPUT node, related to the exposed voltage at node B', may then be read.

The total light energy incident upon the pixel during the integration time (time 1 to time 2) may be obtained by computing the area under the voltage at node A' between time 1 and time 2. This can be approximated by using the exposed and reset values at the output node as the endpoints of the area to be computed. To obtain more accurate values across the entire sensor array, the technique of correlated double sampling (CDS) provides for reading a reset voltage for a "dark image", and correlating the same with the exposed voltage for the exposed image. Thus, to obtain the reset value for the dark image, RESET is toggled at time 4 to turn on the RESET transistor $M_{20}$ again. Then, at times 5 and then 6, $\overline{SAMPLE}$ is toggled twice so as to generate the reset voltage at the OUTPUT node.

To help linearlize the relationship between the voltage at the OUTPUT node and the voltage at node A', the dimensions of transistors $M_{21}$ and $M_{22}$ (where $M_{22}$ is a p-channel FET in the embodiment of FIG. 2) as well as the characteristics of the load (not shown) which is connected to the OUTPUT node can be adjusted by one skilled in the art in an attempt to cancel the gain distortion caused by the n-channel source follower ($M_{21}$) with the distortion introduced by the p-channel $M_{22}$. Also, the combination of n-channel source follower $M_{21}$ and p-channel $M_{22}$ may be able to compensate for the $V_T$ drop from the gate to the source of each transistor, so that in effect a net voltage gain may be obtained at the OUTPUT node with respect to node A'.

The configuration of pixel 200 has been simulated and fabricated using a standard MOS process. It indeed exhibits higher sensitivity, and therefore allows lower integration times than the prior art pixel 100 for equal capacitances $C_2=C_1$. This in turn allows greater image frame rate without the conventional loss in dynamic range at the OUTPUT node suffered by decreasing the integration time in the conventional prior art pixel 100.

Another advantage of the pixel 200 is an increase in total signal-to-noise ratio (SNR) over that of the prior art pixel 100 for equal capacitances $C_1=C_2$. The SNR is increased in part due to the greater sensitivity achieved by configuring $M_{21}$ as an amplifier with current gain between the photodiode $PD_{20}$ and the storage capacitor $C_2$. The SNR can be further improved by increasing the value of $C_2$ to decrease the thermal noise associated with $M_{21}$. The thermal noise for $M_{21}$ may be approximated as being proportional to 1/C where C is the total capacitance from the source node of $M_{21}$ (node B') to ground. Thus, by increasing $C_2$, the thermal noise of $M_{21}$ decreases.

An additional improvement over the prior art pixel 100 lies in the lower 1/f noise (flicker noise) exhibited in transistor $M_{22}$ of pixel 200, as compared to that of $M_{12}$ in the prior art pixel. $M_{22}$ is a p-channel device and so exhibits a 1/f noise several times less than that of $M_{12}$ which is an n-channel device (provided the two devices have comparable dimensions).

Figure 4:
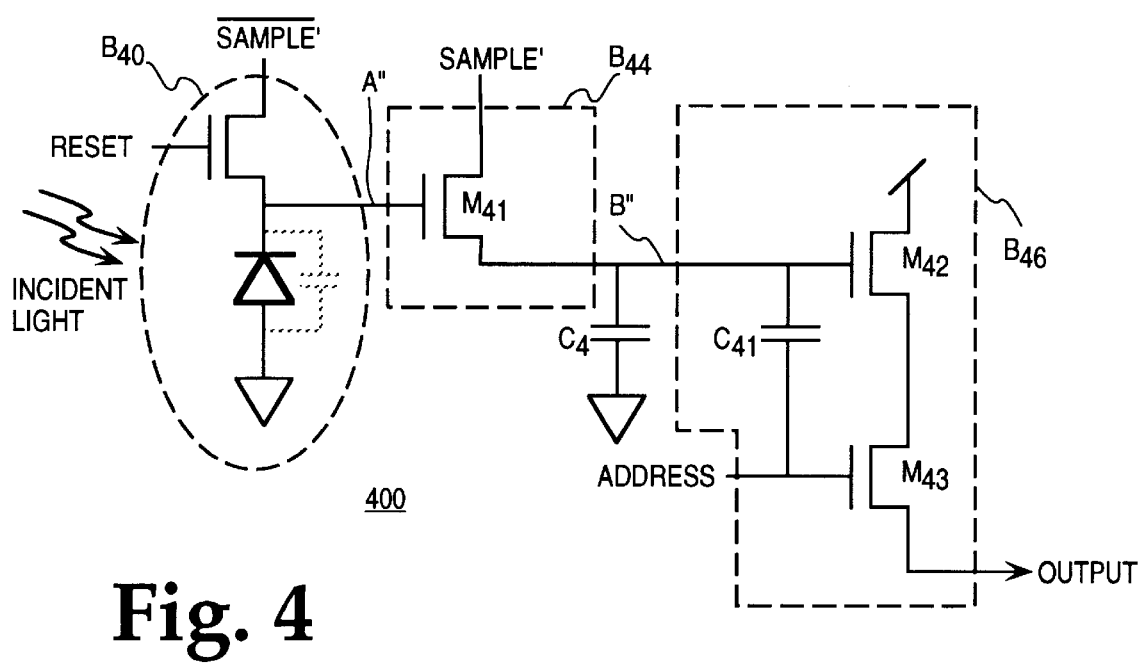
FIG. 4 is a circuit schematic of a pixel according to a second embodiment of the invention.

The embodiment of the invention as pixel 200 included an output stage $B_{26}$ based on a p-channel FET $M_{22}$. Other output stages known to those skilled in the art are possible and will not be discussed in this disclosure. FIG. 4, however, illustrates another embodiment of the invention as a pixel 400 which essentially has the same topology as pixel 200 except that the output stage $B_{46}$ has n-channel FETs $M_{42}$ and $M_{43}$ rather than p-channel devices. Using n-channel devices $M_{42}$ and $M_{43}$ instead of p-channel ones results in a physically smaller pixel 400 as compared to pixel 200, because the n-channel FETs need not use n-wells that would normally be used for implementing the p-channel FETs of pixel 200 in a p-substrate.

In pixel 400 the output stage $B_{46}$ also includes a compensation capacitor $C_{41}$ coupled between the gate of $M_{42}$ and the gate of $M_{43}$ which receives the ADDRESS signal. The ratio of $C_{41}/C_4$ can be adjusted so that the voltage at node B" rises by an additional $V_T$ or more when the ADDRESS signal goes to a high level in order to read the OUTPUT node. For example, $C_4$ may be set approximately equal to ¼ of the total capacitance $C_4+C_{41}$. Using the compensation capacitor $C_4$ to raise the voltage at node B" increases the dynamic range of pixel 400, in particular at a lower end where the voltage at node A" approaches approximately 1 volt.

The pixel 400 in FIG. 4 otherwise operates in much the same way as pixel 200 and in accordance with the timing diagram of FIG. 3 as would be recognized by one skilled in the art, and will therefore not be further discussed in detail.

The above described embodiments of the invention as pixels 200 and 400 may be incorporated into a sensor integrated circuit. The pixels can be arranged in rows and columns to form an array. A column of pixels can have a common output line such that all of the pixels in the column are multiplexed to the single output line. In an alternate embodiment, the pixels in a row can be multiplexed to a single output line. In either case, the analog output lines from each column or row are fed to an analog-to-digital (A/D) conversion unit which in turn provides digital signals to be further processed according to digital signal processing techniques. The A/D unit can be part of the sensor IC, or a different IC depending on the system implementation.

Figure 5:
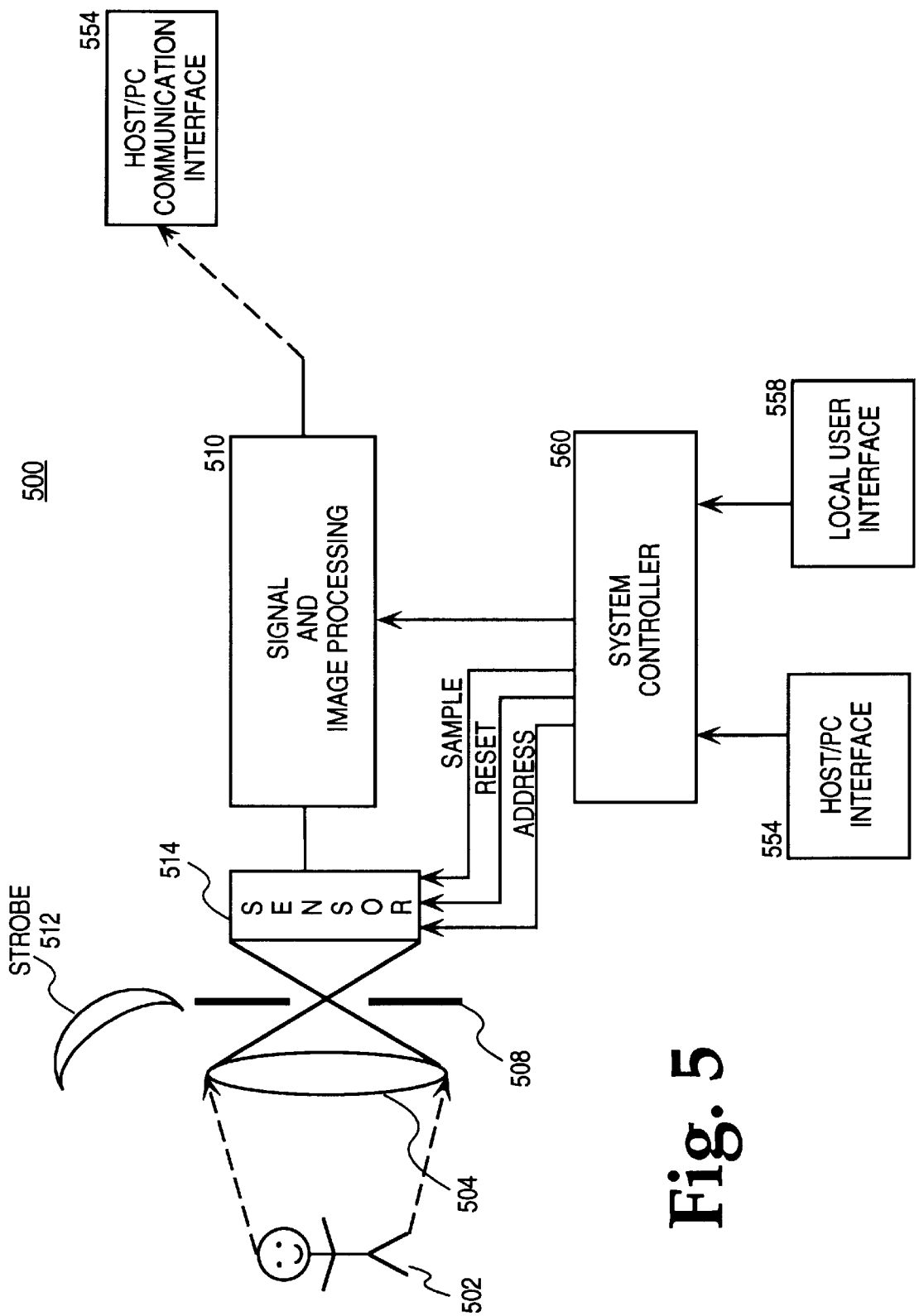
FIG. 5 is a logical block diagram of a digital image capture system according to another embodiment of the invention.

An embodiment of the invention as an imaging system 500 is shown as a logical block diagram in FIG. 5. The imaging system 500 includes a number of conventional elements, such as an optical system having a lens 504 and aperture 508 that is exposed to the incident light reflected from a scene or object 502. The optical system properly channels the incident light towards the image sensor 514 which by virtue of an array of pixels 200 or 400 generates analog or digital sensor signals in response to an image of the object 502 being formed on the sensor 514. The various control signals used in the operation of the pixels 200 and 400, such as RESET, SAMPLE, $\overline{\text{SAMPLE}}$, and $\overline{\text{ADDRESS}}$, can be generated by a system controller 560. The controller 560 may include a microcontroller or a processor with input/output (I/O) interfaces that generates the control signals in response to instructions stored in a non-volatile programmable memory. Alternatively, a logic circuit that is tailored to generate the control signals with proper timing can be used. The system controller also acts in response to user input via the local user interface 558 (as when a user pushes a button or turns a knob of the system 500) or the host/PC interface 554 to manage the operation of the imaging system 500.

To obtain compressed and/or scaled images, a signal and image processing block 510 is provided in which hardware and software operates according to image processing methodologies to generate captured image data with a predefined resolution in response to receiving the sensor signals. Optional storage devices (not shown) can be used aboard the system 500 for storing the captured image data. Such local storage devices may include a removable memory card. A host/Personal Computer (PC) communication interface 554 is normally included for transferring the captured image data to an image processing and/or viewing system such as a computer separate from the imaging system 500. The imaging system 500 can optionally contain a display means (not shown) for displaying the captured image data. For instance, the imaging system 500 may be a portable digital camera having a liquid crystal display or other suitable low power display for showing the captured image data.

To summarize, the invention has been described in terms of various embodiments of pixels for use in an image sensor. The pixel embodiments include an amplifier coupled between a photodetector and a storage capacitor, where a light-generated signal from the photodetector (such as a voltage across a photodiode) is used to control the amount of charge that is placed in the storage capacitor to represent the incident light. For instance, the amplifier may be a MOS FET configured as a source-follower which has a voltage gain of less than unity and a current gain greater than one.

The embodiments of the invention described above are, of course, subject to other variations in structure and implementation. For instance, the pixels 200 and 400 feature transistors whose dimensions may be selected by one skilled in the art in order to achieve proper circuit operation as described above while minimizing power consumption. Also, the value of the storage capacitor may also be selected by one skilled in the art so as to provide the desired trade off between sensitivity and noise immunity, with lower capacitance yielding higher sensitivity but lower noise immunity. The integration time can also be varied so as to yield the desired trade off between pixel resolution and image frame rate. Therefore, the scope of the invention should be determined not by the embodiments illustrated but by the appended claims and their legal equivalents.

What is claimed is:

1. A circuit, comprising:
   photodetecting circuitry providing an original signal;
   a first FET having a gate, a drain, and a source, the first FET to provide an output current in response to receiving the original signal at the gate and a first control signal at the drain; and
   storage circuitry coupled to the source for receiving the output current.

2. A circuit as in claim 1 wherein the FET is n-channel.

3. A circuit as in claim 1 wherein the photodetecting circuitry includes a reset FET coupled to a photodiode, the reset FET being coupled to receive a second control signal that is the complement of the first control signal and that provides a current for resetting the photodiode.

4. A circuit as in claim 1 wherein the storage circuitry comprises a capacitor coupled to a common supply node at one end and for receiving the output current at another end.

5. A circuit as in claim 1 further comprising
an output stage having a second FET of which a gate is coupled to the storage circuitry and a source is coupled to a switch, the switch to selectively provide a current representative of the original signal.

6. A circuit as in 5 wherein said second FET is n-channel, the circuit further comprising
a compensation circuit coupled between the gate of the second FET and a select input of the switch to raise the voltage at the gate of the second FET in response to a select signal being asserted at the select input.

7. A circuit as in claim 6 wherein the storage circuitry includes a first capacitor and the compensation circuit includes a second capacitor, the first and second capacitors being coupled to the gate of the second FET, the capacitance values of said first and second capacitors being selected such that the voltage at the gate is raised by at least one $V_T$ in response to the second capacitor receiving the select signal.

8. An imaging system, comprising:
an optical system for being exposed to incident light;
an image sensor coupled to the optical system to receive the incident light, the sensor having a plurality of pixels, each pixel having
photodetecting circuitry providing an original signal representative of the incident light,
an FET having a gate, a drain, and a source, the FET to provide an output current in response to receiving the original signal at the gate and a first control signal at the drain,
storage circuitry coupled to the source for receiving the output current and in response providing an exposed voltage representative of the incident light, and
analog-to-digital conversion circuitry coupled to the sensor for converting analog signals related to the exposed voltage in each pixel into digital signals representing raw image data.

9. A system as in claim 8 further comprising
means for digital signal and image processing, said means generating captured image data in response to receiving the digital signals; and
an output interface for transferring the captured image data to an image processing system separate from the imaging system.

10. A system as in claim 9 further comprising display means for displaying the captured image data.

11. A system as in claim 9 further comprising an LCD to display the captured image data.

12. A system as in claim 9 further comprising a storage means for receiving and storing the captured image data.

13. A system as in claim 9 further comprising a removable memory card to store the captured image data.

14. A system as in claim 8 further comprising logic circuitry for compressing and scaling the raw image data.

15. A system as in claim 8 further comprising:
a controller for managing the operations of the imaging system in response to instructions stored as firmware.

16. A system as in claim 15 wherein the controller generates the first control signal, a photodetector reset signal, and a pixel address signal for controlling operation of each pixel in the image sensor.

17. An image sensor comprising:
a plurality of bitlines; and
a plurality of pixels arranged as rows and columns to form an array, each pixel in one of the columns having photodetecting circuitry to provide an original signal representative of incident light detected in an integration interval, a first FET having a signal input, a control input, and signal output to provide an output current in response to receiving the original signal at the signal input and a first control signal being asserted at the control input upon completion of the integration interval, first capacitor coupled to the signal output for receiving the output current, and output stage coupled between the capacitor and a respective one of the plurality of bitlines to selectively buffer a voltage of the capacitor onto said respective one of the bitlines.

18. The image sensor of claim 17 wherein the first FET is n-channel.

19. The image sensor of claim 17 wherein the photodetecting circuitry includes a reset FET coupled to a photodiode, the reset FET being coupled to receive a second control signal that is the complement of the first control signal and that provides a current for resetting the photodiode.

20. The image sensor of claim 17 wherein each pixel further comprises a second FET having a gate coupled to the capacitor and a source coupled to a switch, the switch to selectively provide a current representative of the original signal.

21. The image sensor of claim 20 wherein the second FET is n-channel and each pixel further comprises a compensation circuit coupled between the gate of the second FET and a select input of the switch to raise the voltage at the gate of the second FET in response to a select signal being asserted at the select input.

22. The image sensor of claim 20 wherein the compensation circuit includes a second capacitor, the first and second capacitors being coupled to the gate of the second FET, the capacitance values of said first and second capacitors being selected such that the voltage at the gate is raised by at least one $V_T$ in response to the second capacitor receiving the select signal.

* * * * *